US012771298B2

(12) United States Patent
Wong et al.

(10) Patent No.: US 12,771,298 B2

(45) Date of Patent: Oct. 20, 2026

(54) DOHERTY AMPLIFIER

(71) Applicant: SUMITOMO ELECTRIC DEVICE INNOVATIONS, INC., Yokohama (JP)

(72) Inventors: James Wong, Yokohama (JP); Kento Kawasaki, Yokohama (JP)

(73) Assignee: SUMITOMO ELECTRIC DEVICE INNOVATIONS, INC., Yokohama (JP)

(*) Notice: Subject to any disclaimer, the term of this patent is extended or adjusted under 35 U.S.C. 154(b) by 463 days.

(21) Appl. No.: 18/530,690

(22) Filed: Dec. 6, 2023

(65) Prior Publication Data

US 2024/0204729 A1 Jun. 20, 2024

(30) Foreign Application Priority Data

Dec. 20, 2022 (JP) ................................ 2022-203419

(51) Int. Cl.

*H03F 3/195* (2006.01)
*H03F 1/02* (2006.01)
*H03F 1/56* (2006.01)

(52) U.S. Cl.

CPC ............ *H03F 1/0288* (2013.01); *H03F 1/56* (2013.01)

(58) Field of Classification Search

CPC .............. H03F 3/195; H03F 1/02; H03F 1/07
See application file for complete search history.

(56) References Cited

U.S. PATENT DOCUMENTS

| | | | | |
|---|---|---|---|---|
| 5,856,687 A | | 1/1999 | Kimura | |
| 10,381,984 B2 | | 8/2019 | Wu et al. | |
| 11,245,363 B2 | * | 2/2022 | Bouisse | H03F 3/604 |
| 12,176,857 B2 | * | 12/2024 | Komatsuzaki | H03F 3/195 |
| 2020/0313624 A1 | | 10/2020 | Mokhti et al. | |
| 2021/0013572 A1 | | 1/2021 | Zhu | |
| 2025/0202440 A1 | * | 6/2025 | Nagata | H03F 1/565 |

FOREIGN PATENT DOCUMENTS

| | | |
|---|---|---|
| JP | H1022320 A | 1/1998 |
| JP | 2022527051 A | 5/2022 |

OTHER PUBLICATIONS

Extended European Search Report issued on May 28, 2024 for European Patent Application No. 23214905.4.

* cited by examiner

*Primary Examiner* — Henry Choe
(74) *Attorney, Agent, or Firm* — Volpe Koenig

(57) ABSTRACT

A Doherty amplifier includes a substrate, a first transistor provided on the substrate and including first gate electrodes, first drain electrodes, a first gate bus bar and a first drain bus bar, a second transistor provided on the substrate and including second gate electrodes, second drain electrodes, a second gate bus bar having a first end, and a second drain bus bar, a combining node provided on the substrate and combining a first signal amplified by the first transistor and a second signal amplified by the second transistor, a first line provided on the substrate and connecting the first drain bus bar and the combining node, and a second line provided on the substrate, connecting the second drain bus bar and the combining node, and connected to a second end of the second drain bus bar located diagonally across the second transistor with respect to the first end.

10 Claims, 6 Drawing Sheets

DOHERTY AMPLIFIER

CROSS REFERENCE TO RELATED APPLICATIONS

This application claims priority based on Japanese Patent Application No. 2022-203419 filed on Dec. 20, 2022, and the entire contents of the Japanese patent applications are incorporated herein by reference.

FIELD

The present disclosure relates to a Doherty amplifier.

BACKGROUND

A Doherty amplifier is known as an amplifier for amplifying a high frequency signal such as a microwave. In the Doherty amplifier, a main amplifier and a peak amplifier amplify input signals in parallel, and amplified signals are combined by a combiner. It is known that a chip having a main amplifier and a chip having a peak amplifier are mounted on a substrate (for example, U.S. patent Ser. No. 10/381,984).

SUMMARY

A Doherty amplifier according to the present disclosure includes a substrate; a first transistor provided on the substrate, the first transistor including: a plurality of first gate electrodes extending in a first direction; a plurality of first drain electrodes extending in the first direction; a first gate bus bar to which a first signal of two signals obtained by dividing an input signal is input and to which the plurality of first gate electrodes are electrically connected; and a first drain bus bar provided so as to dispose the plurality of first gate electrodes and the plurality of first drain electrodes between the first gate bus bar and the first drain bus bar, the plurality of first drain electrodes being electrically connected to the first drain bus bar; a second transistor provided on the substrate, the transistor including: a plurality of second gate electrodes extending in a second direction; a plurality of second drain electrodes extending in the second direction; a second gate bus bar having a first end to which a second signal of the two signals is input, the plurality of second gate electrodes being electrically connected to the second gate bus bar; and a second drain bus bar provided so as to dispose the plurality of second gate electrodes and the plurality of second drain electrodes between the second gate bus bar and the second drain bus bar, the plurality of second drain electrodes being electrically connected to the second drain bus bar; a combining node provided on the substrate and combining the first signal amplified by the first transistor and the second signal amplified by the second transistor; a first line provided on the substrate and connecting the first drain bus bar and the combining node; and a second line provided on the substrate, connecting the second drain bus bar and the combining node, and connected to a second end of the second drain bus bar located diagonally across the second transistor with respect to the first end.

DETAILED DESCRIPTION OF EMBODIMENTS

Figure 1:
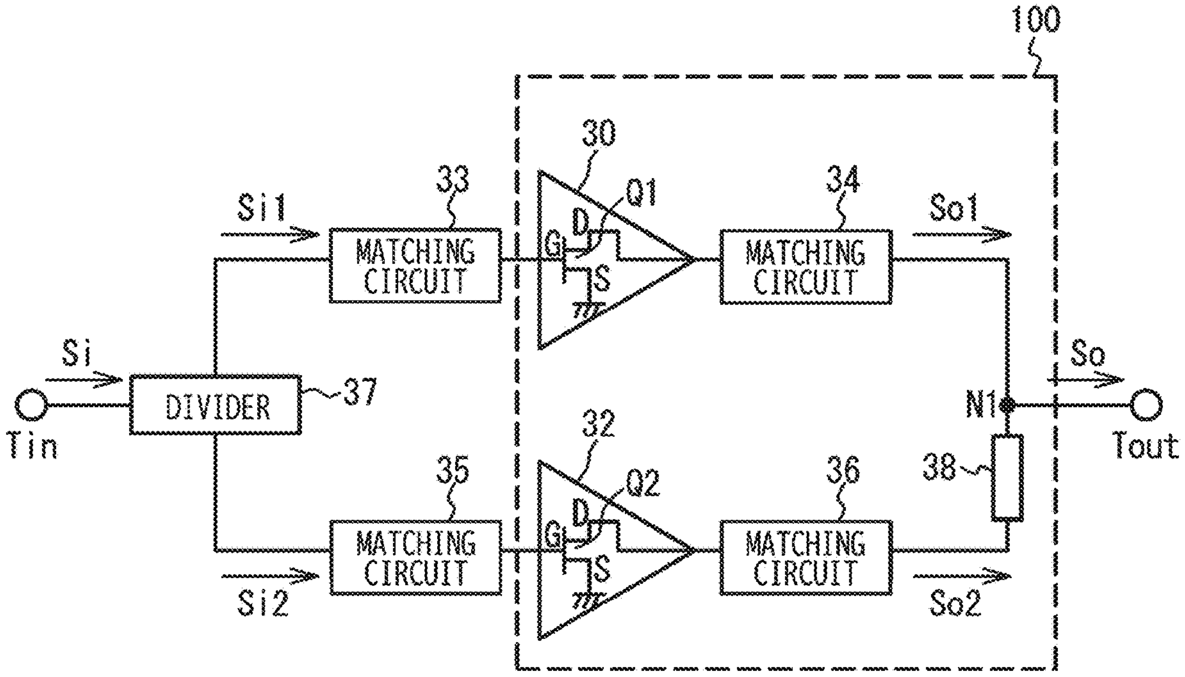
FIG. 1 is a circuit diagram of a Doherty amplifier according to a first embodiment.

However, in the case where the main amplifier and the peak amplifier are formed on a single substrate to form a single chip, a size of the chip becomes large in order to suppress the deterioration of characteristics.

The present disclosure has been made in view of the above-described problems, and an object of the present disclosure is to reduce the size.

DETAILS OF EMBODIMENTS OF THE PRESENT DISCLOSURE

First, the contents of the embodiments of this disclosure are listed and explained.

(1) A Doherty amplifier according to the present disclosure includes a substrate; a first transistor provided on the substrate, the first transistor including: a plurality of first gate electrodes extending in a first direction; a plurality of first drain electrodes extending in the first direction; a first gate bus bar to which a first signal of two signals obtained by dividing an input signal is input and to which the plurality of first gate electrodes are electrically connected; and a first drain bus bar provided so as to dispose the plurality of first gate electrodes and the plurality of first drain electrodes between the first gate bus bar and the first drain bus bar, the plurality of first drain electrodes being electrically connected to the first drain bus bar; a second transistor provided on the substrate, the transistor including: a plurality of second gate electrodes extending in a second direction; a plurality of second drain electrodes extending in the second direction; a second gate bus bar having a first end to which a second signal of the two signals is input, the plurality of second gate electrodes being electrically connected to the second gate bus bar; and a second drain bus bar provided so as to dispose the plurality of second gate electrodes and the plurality of second drain electrodes between the second gate bus bar and the second drain bus bar, the plurality of second drain electrodes being electrically connected to the second drain bus bar; a combining node provided on the substrate and combining the first signal amplified by the first transistor and the second signal amplified by the second transistor; a first line provided on the substrate and connecting the first drain bus bar and the combining node; and a second line provided on the substrate, connecting the second drain bus bar and the combining node, and connected to a second end of the second drain bus bar located diagonally across the second transistor with respect to the first end. Thereby, the deterioration of the characteristics such as the combined loss caused by a phase difference can be suppressed, so that the size can be reduced.

(2) In the above (1), the combining node may be provided in a region of the first transistor positioned in the first direction, and the first end may be closer to the first transistor than the second end and may be further from the combining node than the second end in the first direction. Thereby, it is possible to reduce the size.

(3) In the above (2), a width of the second transistor in the first direction may be larger than a width of the first transistor in the first direction, and the second transistor may overlap with the first transistor and overlap with at least a part of the first line when viewed from a direction orthogonal to the first direction. Thereby, the length of the first line can be secured.

(4) In the above (3), a gate width of the second transistor may be larger than a gate width of the first transistor. Thereby, the deterioration of the characteristics can be suppressed in a structure in which the deterioration of the characteristics is likely to occur.

(5) In the above (4), the first direction and the second direction may intersect each other. Thereby, the length of the first line can be secured.

(6) In the above (4), the first direction and the second direction orthogonally intersect each other. Thereby, it is possible to reduce the size.

(7) In any one of the above (1) to (6), the second line may include an impedance converter. Thereby, it is possible to reduce the size in a structure in which the first line becomes long.

(8) In any one of the above (1) to (7), a width of the second drain bus bar at the second end may be larger than a width of the second drain bus bar at a third end opposite to the second end portion. Thereby, the second drain bus bar can serve as a line having a function of a matching circuit.

(9) In any one of the above (1) to (8), the first transistor may include a plurality of first source electrodes extending in the first direction. One of the plurality of first gate electrodes may be disposed between one of the plurality of first source electrodes and one of the plurality of first drain electrodes. The second transistor may include a plurality of second source electrodes extending in the second direction. One of the second gate electrodes may be disposed between one of the second source electrodes and one of the second drain electrodes. Thereby, the first transistor and the second transistor can be multi-finger transistors.

(10) In any one of the above (1) to (9), the first transistor may be a main amplifier, and the second transistor may be a peak amplifier. Thereby, a saturated power of the peak amplifier can be made larger than a saturated power of the main amplifier.

Specific examples of the Doherty amplifier in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a circuit diagram of the Doherty amplifier according to the first embodiment. As illustrated in FIG. 1, in the Doherty amplifier of the first embodiment, a main amplifier 30 and a peak amplifier 32 are connected in parallel between an input terminal Tin and an output terminal Tout. A high frequency signal is input to the input terminal Tin as an input signal Si. When the Doherty amplifier is used in a base station for mobile communication, the frequency of the high frequency signal is, for example, 0.5 GHz or more and 20 GHz or less. A divider 37 divides the input signal Si input to the input terminal Tin into signals Si1 (a first signal) and Si2 (a second signal). The divider 37 is, for example, a Wilkinson-type divider.

The signal Si1 passes through a matching circuit 33 and is input to the main amplifier 30. The matching circuit 33 matches an impedance seen from the divider 37 to the matching circuit 33 with an impedance seen from the matching circuit 33 to the main amplifier 30. The main amplifier 30 amplifies the signal Si1 and outputs an amplified signal. A signal So1 amplified by the main amplifier 30 passes through a matching circuit 34 and is output to a node N1. The matching circuit 34 matches an impedance seen from the main amplifier 30 to the matching circuit 34 with an impedance seen from the matching circuit 34 to the node N1.

The signal Si2 passes through a matching circuit 35 and is input to the peak amplifier 32. The matching circuit 35 matches an impedance seen from the divider 37 to the matching circuit 35 with an impedance seen from the matching circuit 35 to the peak amplifier 32. The peak amplifier 32 amplifies the signal Si2 and outputs an amplified signal. A signal So2 amplified by the peak amplifier 32 passes through a matching circuit 36 and an impedance converter 38 and is output to the node N1. The matching circuit 36 matches an impedance seen from the peak amplifier 32 to the matching circuit 36 to an impedance seen from the matching circuit 36 to the impedance converter 38.

The node N1, which is a combining node, combines the signal So1 output from the main amplifier 30 and the signal So2 output from the peak amplifier 32, and outputs the combined signal as an output signal So to the output terminal Tout. A bias circuit for supplying a bias voltage to the main amplifier 30 and the peak amplifier 32 and a phase adjustment circuit for adjusting the phases of the signals So1 and So2 are not illustrated.

The main amplifier 30 and the peak amplifier 32 include transistors Q1 and Q2, respectively. The transistors Q1 and Q2 are field effect transistors (FETs). A source S of the transistor Q1 is grounded, the signal Si1 is input to a gate G of the transistor Q1, and the signal So1 is output from a drain D of the transistor Q1. A source S of the transistor Q2 is grounded, the signal Si2 is input to a gate G of the transistor Q2, and the signal So2 is output from a drain D of the transistor Q2.

The transistors Q1 and Q2 are, for example, GaN HEMT (Gallium Nitride High Electron Mobility Transistor) or LDMOS (Laterally Diffused Metal Oxide Semiconductor). The sizes of the main amplifier 30 and the peak amplifier 32 (for example, the gate widths of the transistors Q1 and Q2) may be the same or different. For example, the gate width of the transistor Q2 is twice the gate width of the transistor Q1. At this time, a saturated electric power of the peak amplifier 32 is about twice as large as that of the main amplifier 30.

The main amplifier 30 performs class AB or class B operation, and the peak amplifier 32 performs class C operation. When the input power of the input signal Si is small, the main amplifier 30 mainly amplifies the input signal Si. When the input power becomes large, the peak amplifier 32 amplifies the peak of the input signal Si in addition to the main amplifier 30. Thus, the main amplifier 30 and the peak amplifier 32 amplify the input signal Si.

When the input power is small and the peak amplifier 32 does not operate, the matching circuit 36 substantially opens the impedance seen from the impedance converter 38 to the matching circuit 36. Therefore, the matching circuit 36 has a transmission line for converting the impedance. Thus, the impedance seen from the matching circuit 34 to the node N1 when the peak amplifier 32 operates is different from that when the peak amplifier 32 does not operate. The matching circuit 34 is designed such that the main amplifier 30 operates optimally at the saturated electric power (e.g. the efficiency is maximized) at any impedance. When the input power is large and the peak amplifier 32 operates, the matching circuit 36 is designed such that the peak amplifier 32 operates optimally at the saturated electric power (e.g. efficiency is maximized).

The impedance converter 38 is a transmission line having a length of approximately λ/4, for example (e.g. λ/8 or more and 3λ/8 or less). The "λ" is a wavelength at the center frequency of the operating band. The impedance is converted by appropriately selecting a characteristic impedance of the transmission line. The impedance seen from the matching circuit 36 to the impedance converter 38 is converted into the impedance seen from the impedance converter 38 to the node N1. The matching circuits 34 and 36 and the impedance converter 38 are set so that a phase difference between the signals So1 and So2 at the node N1 becomes small.

The transistors Q1 and Q2, the main amplifier 30, the peak amplifier 32, the matching circuits 34 and 36, the impedance converter 38 and the node N1 are provided in a semiconductor chip 100.

Figure 2:
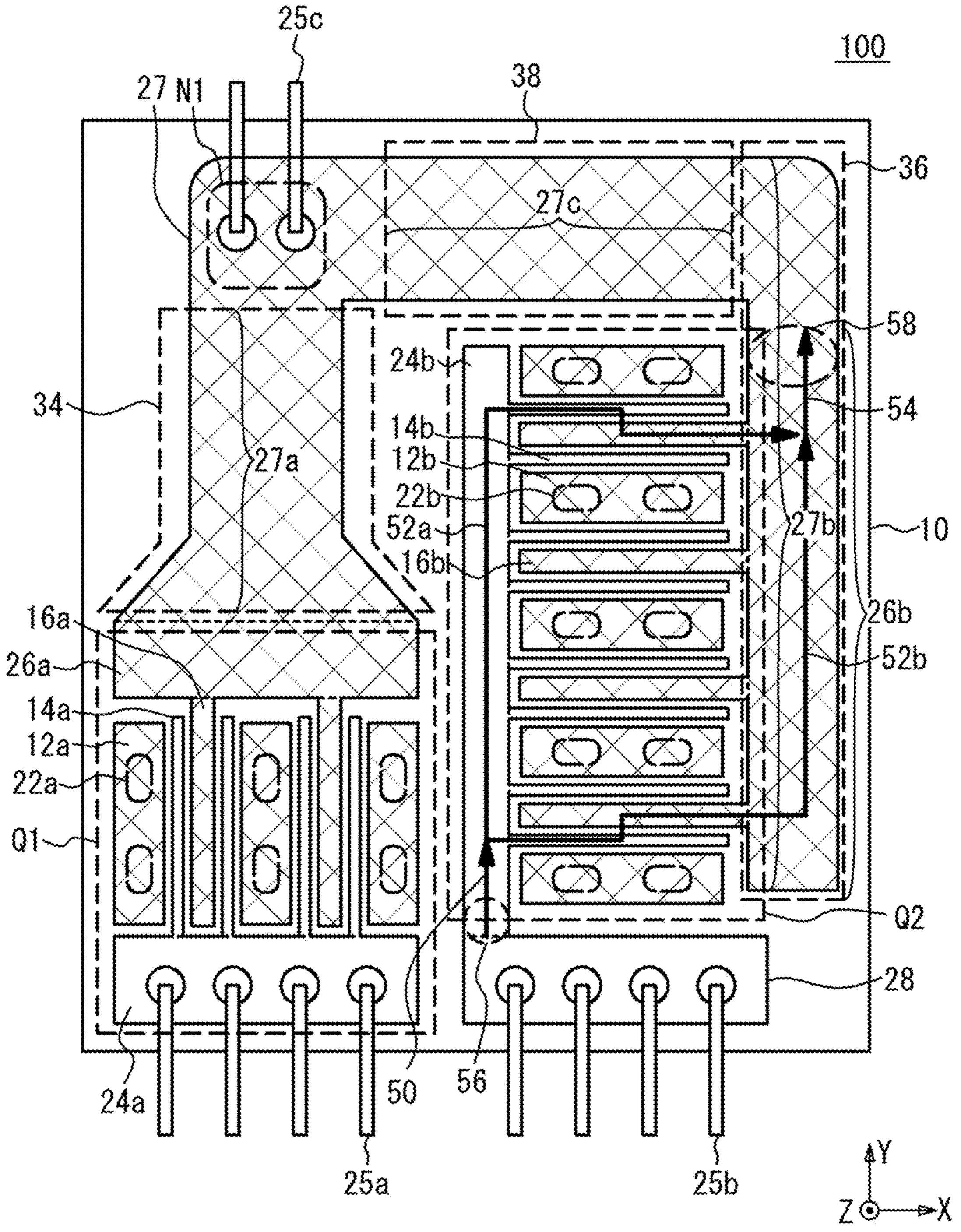
FIG. 2 is a plan view of a semiconductor chip according to the first embodiment.

FIG. 2 is a plan view of the semiconductor chip according to the first embodiment. A normal direction of a substrate 10 is a Z direction, an extending direction of source electrodes 12*a*, gate electrodes 14*a*, and drain electrodes 16*a* in the transistor Q1 is a Y direction, and an arrangement direction of the source electrodes 12*a*, the gate electrodes 14*a*, and the drain electrodes 16*a* is an X direction.

As illustrated in FIG. 2, the transistor Q1 (first transistor) and the transistor Q2 (second transistor), the matching circuits 34 and 36, the impedance converter 38, and the node N1 are provided on the substrate 10. The transistor Q1 is provided in a region in a negative direction (−direction) of the X direction and a negative direction (−direction) of the Y direction on an upper surface of the substrate 10.

The transistor Q1 has the plurality of source electrodes 12*a* (first source electrodes), the plurality of gate electrodes 14*a* (first gate electrodes), and the plurality of drain electrodes 16*a* (first drain electrodes). The source electrodes 12*a*, the gate electrodes 14*a* and the drain electrodes 16*a* are source fingers, gate fingers and drain fingers, respectively, and extend in the Y direction and are arranged in the X direction. In the X direction, one source electrode 12*a* and one drain electrode 16*a* are alternately provided. The gate electrode 14*a* is provided between one source electrode 12*a* and one drain electrode 16*a* in the X direction.

The source electrodes 12*a* are electrically connected to and short-circuited with a metal layer that is provided on a lower surface of the substrate 10 and supplied with a reference potential through via holes 22*a*. The gate electrodes 14*a* are electrically connected to and short-circuited to a gate bus bar 24*a* (first gate bus bar) at a negative end (−end) in the Y direction. The drain electrodes 16*a* are electrically connected to a drain bus bar 26*a* (first drain bus bar) at a positive end (+end) in the Y direction. The gate bus bar 24*a* and the drain bus bar 26*a* sandwich the source electrodes 12*a*, the gate electrodes 14*a* and the drain electrodes 16*a*. The gate bus bar 24*a* extends in the X direction and also serves as a gate pad. A plurality of bonding wires 25*a* arranged in the X direction are bonded to the gate bus bar 24*a*.

The transistor Q2 is provided in a region in a positive direction (+direction) of the X direction and in the negative direction (−direction) of the Y direction on the upper surface of the substrate 10. The gate width of the transistor Q2 is larger than that of transistor Q1, for example, twice the gate width of transistor Q1. The transistor Q2 has a plurality of source electrodes 12*b* (second source electrodes), a plurality of gate electrodes 14*b* (second gate electrodes), and a plurality of drain electrodes 16*b* (second drain electrodes). The source electrodes 12*b*, the gate electrodes 14*b* and the drain electrodes 16*b* are source fingers, gate fingers and drain fingers, respectively, and extend in the X direction and are arranged in the Y direction. In the Y direction, one source electrode 12*b* and one drain electrode 16*b* are alternately provided. The gate electrode 14*b* is provided between one source electrode 12*b* and one drain electrode 16*b* in the Y direction. The extending direction of the source electrodes 12*a*, the gate electrodes 14*a*, and the drain electrodes 16*a* of the transistor Q1 is substantially orthogonal to the extending direction of the source electrodes 12*b*, the gate electrodes 14*b*, and the drain electrodes 16*b* of the transistor Q2.

The source electrodes 12*b* are electrically connected to and short-circuited with a metal layer that is provided on the lower surface of the substrate 10 and supplied with a reference potential through via holes 22*b*. The gate electrodes 14*b* are electrically connected to and short-circuited to a gate bus bar 24*b* (second gate bus bar) at the −end in the X direction. The drain electrodes 16*b* are electrically connected to a drain bus bar 26*b* (second drain bus bar) at the +end in the X direction. The gate bus bar 24*b* and the drain bus bar 26*b* sandwich the source electrodes 12*b*, the gate electrodes 14*b* and the drain electrodes 16*b*. A gate pad 28 is electrically connected to a −end of the gate bus bar 24*b* in the Y direction. The gate pad 28 extends in the X direction, and a plurality of bonding wires 25*b* arranged in the X direction are bonded to the gate pad 28.

A wiring layer 27 is provided on the upper surface of the substrate 10. The wiring layer 27 forms a line 27*a* (first line), a line 27*b*, a line 27*c* (second line) and the node N1 (combining node). The line 27*a* extends in the Y direction. A −end of the line 27*a* in the Y direction is electrically connected near the center of the drain bus bar 26*a* in the X direction, and a +end of the line 27*a* in the Y direction is electrically connected to the node N1. Thus, the line 27*a* electrically connects the drain bus bar 26*a* and the node N1. At least a part of the line 27*b* also serves as the drain bus bar 26*b*. The line 27*c* extends in the X direction. A+end of the line 27*c* in the X direction is electrically connected to the line 27*b*, and a −end of the line 27*c* in the X direction is electrically connected to the node N1. Thus, the line 27*c* electrically connects the drain bus bar 26*b* and the node N1.

Each of the lines 27*a* to 27*c* and the metal layer provided on the lower surface of the substrate 10 forms a transmission line (microstrip line). By appropriately designing the length and the width of the line 27*a*, the transmission line including the line 27*a* forms at least a part of the matching circuit 34. By appropriately designing the length and the width of line 27*b*, the transmission line including line 27*b* forms at least a part of the matching circuit 36. By appropriately designing the length and the width of the line 27*c*, the transmission line including the line 27*c* forms the impedance converter 38 of approximately λ/4 length. Bonding wires 25*c* are bonded to the node N1.

The signal Si1 is input from the bonding wires 25*a* to the gate bus bar 24*a*. The signal So1 amplified by the transistor Q1 passes through the line 27*a* and reaches the node N1. The signal Si2 is input from the bonding wires 25*b* to the gate pad 28. The signal So2 amplified by the transistor Q2 passes through the lines 27*b* and 27*c* and reaches the node N1. At the node N1, the signals So1 and So2 are combined, and the combined signal So is output from the bonding wires 25*c*.

When the transistors Q1 and Q2 are GaN HEMTs, the substrate 10 includes, for example, a substrate and a semiconductor layer provided on the substrate. The substrate is, for example, a silicon carbide (SiC) substrate, a diamond substrate, a silicon substrate, a gallium nitride (GaN) substrate, or a sapphire substrate. The semiconductor layer includes, for example, a gallium nitride electron transport layer and an aluminum gallium nitride (AlGaN) barrier layer provided on the gallium nitride electron transport layer. The source electrodes 12*a* and 12*b* and the drain electrodes 16*a* and 16*b* are, for example, an adhesion film (for example, a titanium film) provided on the substrate 10 and a metal film such as an aluminum film provided on the adhesion film. A wiring layer such as a gold layer may be provided on the aluminum film. The gate electrodes 14*a* and 14*b* are, for example, an adhesion film (for example, a nickel film) provided on the substrate 10 and a metal film such as a gold film provided on the adhesion film. The wiring layer 27 is, for example, a metal layer such as a gold layer.

First Comparative Example

Figure 3:
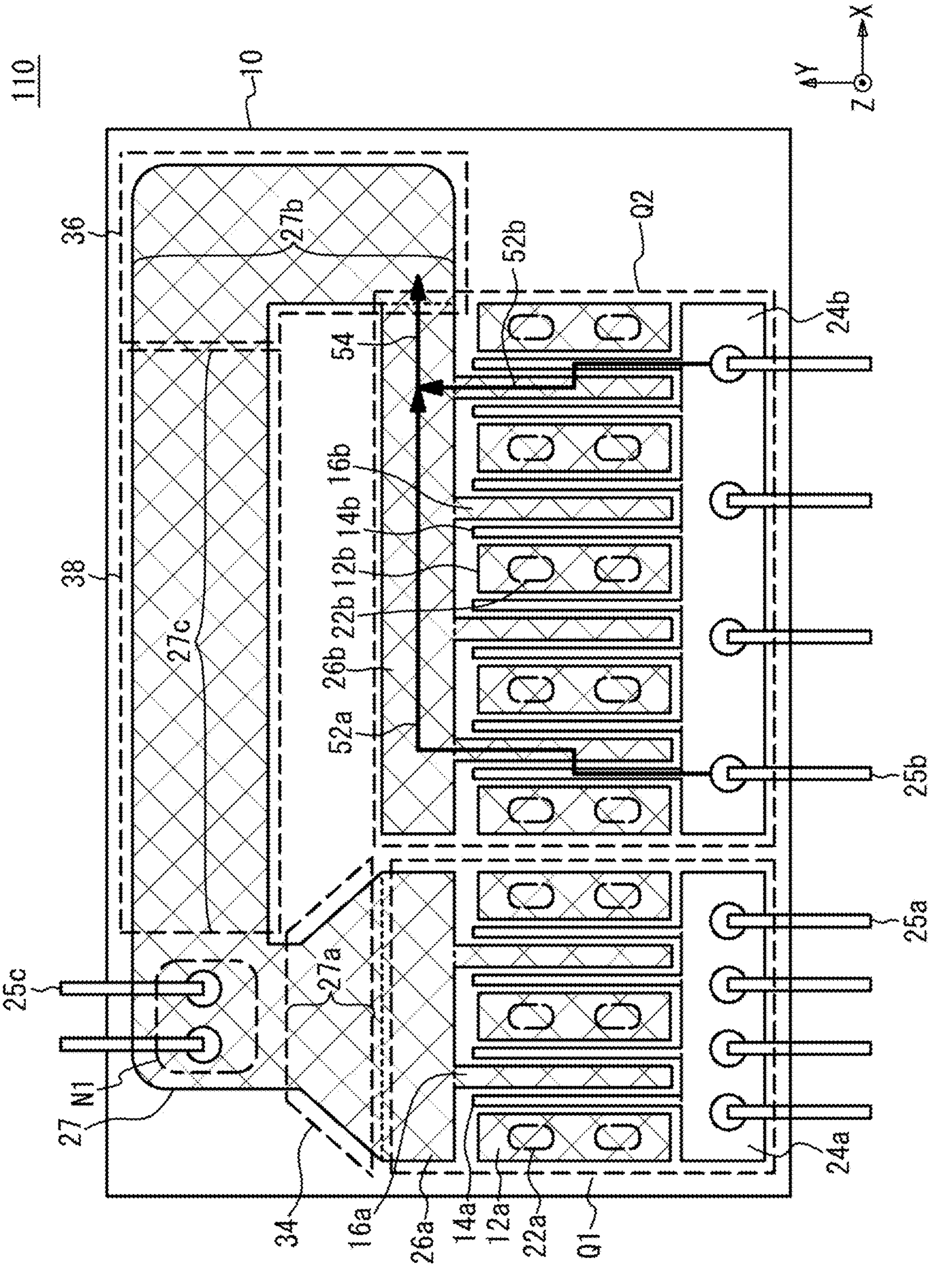
FIG. 3 is a plan view of a semiconductor chip in a first comparative example.

FIG. 3 is a plan view of a semiconductor chip according to a first comparative example. In a semiconductor chip 110 of the first comparative example, the source electrodes 12*b*, the gate electrodes 14*b*, and the drain electrodes 16*b* of the transistor Q2 extend in the Y direction and are arranged in the X direction. The gate electrodes 14*b* are electrically connected to the gate bus bar 24*b* at the −end in the Y direction. The drain electrodes 16*b* are electrically connected to the drain bus bar 26*b* at the +end in the Y direction. The gate bus bar 24*b* also serves as a gate pad, and the plurality of bonding wires 25*b* arranged in the X direction are bonded to the gate bus bar 24*b*.

The line 27*b* is provided separately from the drain bus bar 26*b*. A −end of the line 27*b* in the Y direction is electrically connected to a +end of the drain bus bar 26*b* in the X direction. Other configurations are the same as those of the first embodiment, and description thereof is omitted.

In the first comparative example, a signal 52*a* input near a −end in the X direction of the gate bus bar 24*b* passes through the gate electrode 14*b*, the drain electrode 16*b*, and the drain bus bar 26*b* near the −end of the gate bus bar 24*b* in the X direction. A signal 52*b* input near a +end in the X direction of the gate bus bar 24*b* passes through the gate electrode 14*b* and the drain electrode 16*b* near the +end of the gate bus bar 24*b* in the X direction. The signals 52*a* and 52*b* are combined near the +end in the X direction of the drain bus bar 26*b* and output to the line 27*b* as a signal 54. The signal 52*a* passes through the drain bus bar 26*b*, while the signal 52*b* hardly passes through the drain bus bar 26*b*. Therefore, a phase difference between the signals 52*a* and 52*b* becomes large. Therefore, when the signals 52*a* and 52*b* are combined, a combined loss due to the phase difference occurs.

Second Comparative Example

Figure 4:
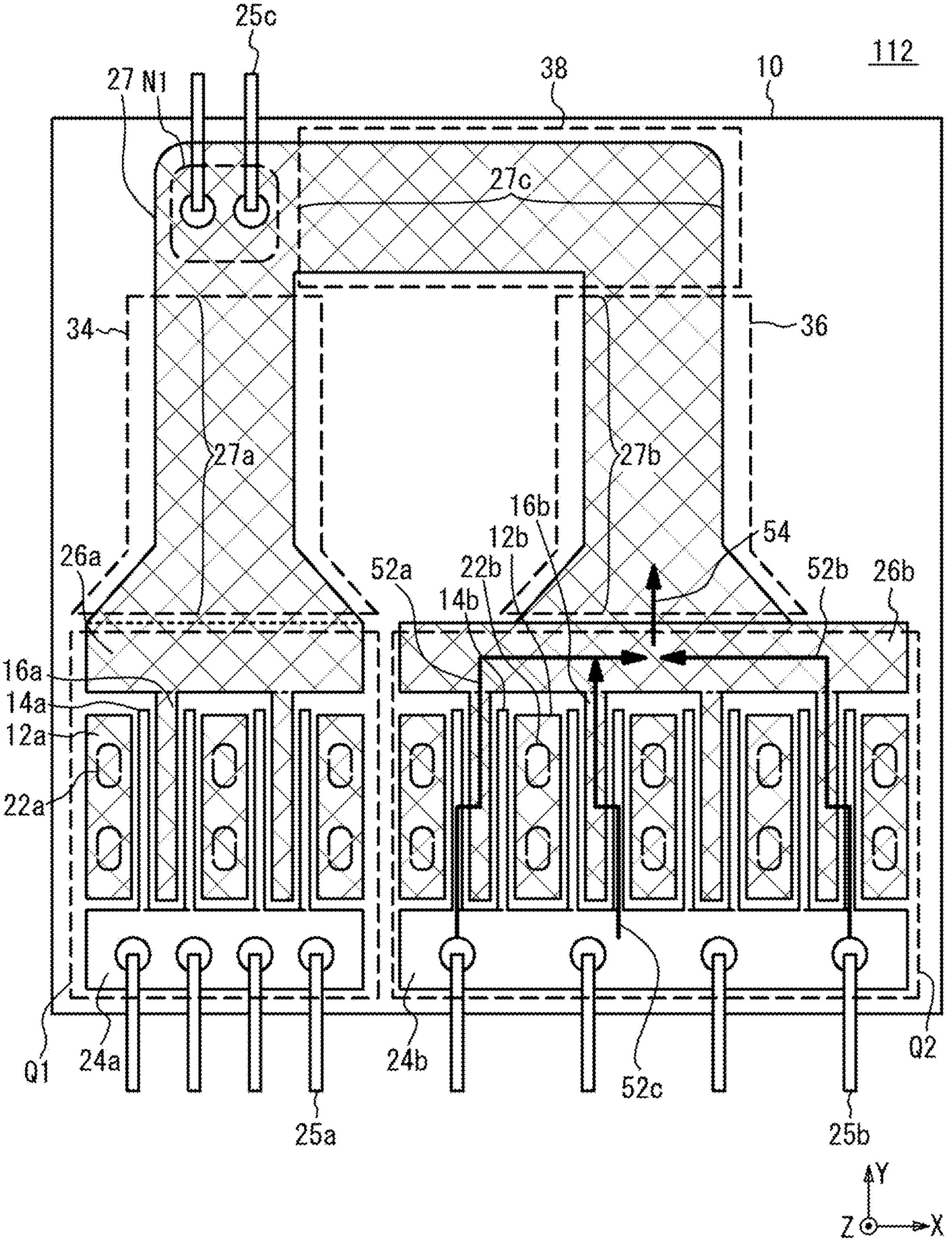
FIG. 4 is a plan view of a semiconductor chip in a second comparative example.

FIG. 4 is a plan view of a semiconductor chip according to a second comparative example. In a semiconductor chip 112 of the second comparative example, the −end of the line 27*b* in the Y direction is electrically connected to the vicinity of the center of the drain bus bar 26*b* in the X direction. Thus, after the signals 52*a* and 52*b* pass through the drain bus bar 26*b* to the same extent, they are combined at a central portion in the X direction of the drain bus bar 26*b* and output to the line 27*b* as the signal 54. For this reason, the phase difference between the signals 52*a* and 52*b* is small. Therefore, when the signals 52*a* and 52*b* are combined, the combined loss due to the phase difference is less likely to occur.

As described above, in the second comparative example, the phase difference between the signals 52*a* and 52*b* in the transistor Q2 is less likely to occur than in the first comparative example, and the combined loss can be suppressed. However, when the width of the transistor Q2 in the X direction is large, a phase difference occurs between a signal 52*c* that has passed through the gate electrode 14*b* of the central portion in the X direction and the signals 52*a* and 52*b*. Thereby, a combined loss smaller than that of the first comparative example occurs. The lines 27*a* to 27*c* are provided on the upper surface of the substrate 10. Since the line 27*c* functions as the impedance converter 38, the line 27*c* has a length of about λ/4. The line 27*b* has a length that functions as the matching circuit 36. The line 27*a* and the lines 27*b* and 27*c* are set so that the phase difference between the signals So1 and So2 at the node N1 becomes small. Therefore, in order to secure the total length of the lines 27*b* and 27*c*, the line 27*b* extends in the Y direction and the line 27*c* extends in the X direction. As a result, an area of the substrate 10 is increased, and a size of the semiconductor chip 112 is increased. In an asymmetric Doherty amplifier, the gate width of the transistor Q2 is larger than that of the transistor Q1. In this case, an output impedance of the peak amplifier 32 becomes lower than an output impedance of the main amplifier 30. For example, the output impedance of the peak amplifier 32 is 0.8 times or less and 0.5 times or more of the output impedance of the main amplifier 30. Therefore, the line 27*b* functioning as the matching circuit is longer than the line 27*a*. Therefore, the size of the semiconductor chip 112 is more increased.

According to the first embodiment, as illustrated in FIG. 2, signals 50 input from the bonding wires 25*b* to the gate pad 28 are input to a first end 56 near the −end in the Y direction of the gate bus bar 24*b*. The line 27*c* connecting the drain bus bar 26*b* and the node N1 (combining node) is connected to a second end 58 of the drain bus bar 26*b* located diagonally across the transistor Q2 with respect to the first end 56. Thus, the signal 52*a* of the signals 50 input to the first end 56 of the gate bus bar 24*b* passes through the gate bus bar 24*b*, the gate electrode 14*b* near the +end in the Y direction, and the drain electrode 16*b*. The signal 52*b* of the signals 50 passes through the gate electrode 14*b* near the −end in the Y direction, the drain electrode 16*b* and the drain bus bar 26*b*. The signals 52*a* and 52*b* are combined at the second end 58 of the drain bus bar 26*b* and output to the line 27*c* as the signal 54. The signals 52*a* and 52*b* pass through the gate bus bar 24*b* and the drain bus bar 26*b* by an equal distance, respectively. For this reason, the phase difference between the signals 52*a* and 52*b* becomes small. Therefore, when the signals 52*a* and 52*b* are combined, the combined loss due to the phase difference is less likely to occur. Therefore, the deterioration of characteristics can be suppressed.

The node N1 is provided in a region located in the first direction (+direction in the Y direction) of the transistor Q1. The first end 56 is closer to the transistor Q1 than the second end 58 and is further from the node N1 than the second end 58 in the first direction (Y direction). In such an arrangement, since a distance between the second end 58 and the node N1 can be secured, the line 27*c* having a long line length can be provided. Therefore, the semiconductor chip can be reduced in size.

The width of the transistor Q2 in the Y direction is larger than the width of the transistor Q1 in the Y direction, and when viewed from the X direction, the transistor Q2 overlaps with the transistor Q1 and overlaps with at least a part of the line 27*a*. Thus, the length of the line 27*a* functioning as the matching circuit 34 can be secured.

When the Doherty amplifier is the asymmetric Doherty amplifier, the saturated electric power of the peak amplifier 32 is made larger than that of the main amplifier 30. Therefore, the gate width of the transistor Q2 is larger than that of the transistor Q1. In this case, the gate bus bar 24*b* and the drain bus bar 26*b* of the transistor Q2 become long, and the phase difference between the signals 52*a* and 52*b* becomes large as in the first comparative example. Therefore, by inputting the signal Si2 to the first end 56 and outputting the signal So2 from the second end 58, the combined loss can be suppressed. Further, the output impedance of the transistor Q2 is lower than the output impedance of the transistor Q1. Therefore, the line 27*b* is longer than the line 27*a* for impedance matching.

Since the gate width of the transistor Q1 is small, even if the line 27*a* is connected to the vicinity of the center in the X direction of the drain bus bar 26*a*, the phase difference between the signal passing through the gate electrode 14*a* near the −end in the X direction and the signal passing through the gate electrode 14*a* near the +end in the X direction is less likely to occur. The gate width of the transistor Q2 is, for example, 1.2 times or more and 1.5 times or more of the gate width of the transistor Q1. In addition, a portion of the line 27*a* close to the drain bus bar 26*a* has a tapered shape in which the width becomes wider as it approaches the drain bus bar 26*a*. As a result, the bandwidth can be widened.

Since the gate bus bar 24*b* and the drain bus bar 26*b* are long, a first direction in which the source electrodes 12*a*, the gate electrodes 14*a* and the drain electrodes 16*a* of the transistor Q1 extend intersects with a second direction in which the source electrodes 12*b*, the gate electrodes 14*b* and the drain electrodes 16*b* of the transistor Q2 extend. Thus, the length of the line 27*a* can be secured. Further, coupling of the high frequency signals between the transistors Q1 and Q2 is suppressed.

By making the first direction and the second direction orthogonal to each other, the semiconductor chip can be reduced in size. In addition, coupling of the high frequency signals between the transistors Q1 and Q2 is further suppressed. The term "the first direction and the second direction are orthogonal (or substantially orthogonal) to each other" means that the first direction and the second direction do not have to be geometrically orthogonal, and an angle formed by the first direction and the second direction may be within a range of 90 degrees±10 degrees.

The line 27*c* includes the impedance converter 38. The impedance converter 38 converts an impedance of a nearly resistive component to an impedance of a nearly resistive component having a different magnitude of resistive component. Therefore, the length of the line 27*c* is about λ/4 (for example, λ/8 or more and 3λ/8 or less). Therefore, the long line 27*c* is provided. As a result, by ensuring the distance between the drain bus bar 26*b* and the node N1, the semiconductor chip can be reduced in size.

Since the line 27*c* is connected to the end portion of the drain bus bar 26*b*, the drain bus bar 26*b* can also function as the line 27*b* having the function of the matching circuit 36. Thus, the semiconductor chip can be reduced in size. When the line is connected to the central portion of the drain bus bar 26*b* as illustrated in FIG. 4 of the second comparative example, it is difficult to make the drain bus bar 26*b* also function as the line 27*b*.

By adjusting the position of the bonding wire 25*c* bonded to the node N1, the phase difference between the signals So1 and So2 combined at the node N1 can be reduced.

One gate electrode 14*a* is disposed between one source electrode 12*a* and one drain electrode 16*a*, and one gate electrode 14*b* is disposed between one source electrode 12*b* and one drain electrode 16*b*. Thus, the transistors Q1 and Q2 can be multi-finger transistors. In FIG. 2, the source electrodes 12*a* and 12*b* are supplied with the reference potential through the via holes 22*a* and 22*b*, respectively. Source bus bars to which the plurality of source electrodes 12*a* and the plurality of source electrodes 12*b* are electrically connected, respectively, may be provided on the substrate 10.

When the saturated electric power of the peak amplifier 32 is made larger than the saturated electric power of the main amplifier 30, the transistor Q1 is the main amplifier 30 and the transistor Q2 is the peak amplifier 32. The transistor Q1 may be the peak amplifier 32, and the transistor Q2 may be the main amplifier 30.

Second Embodiment

Figure 5:
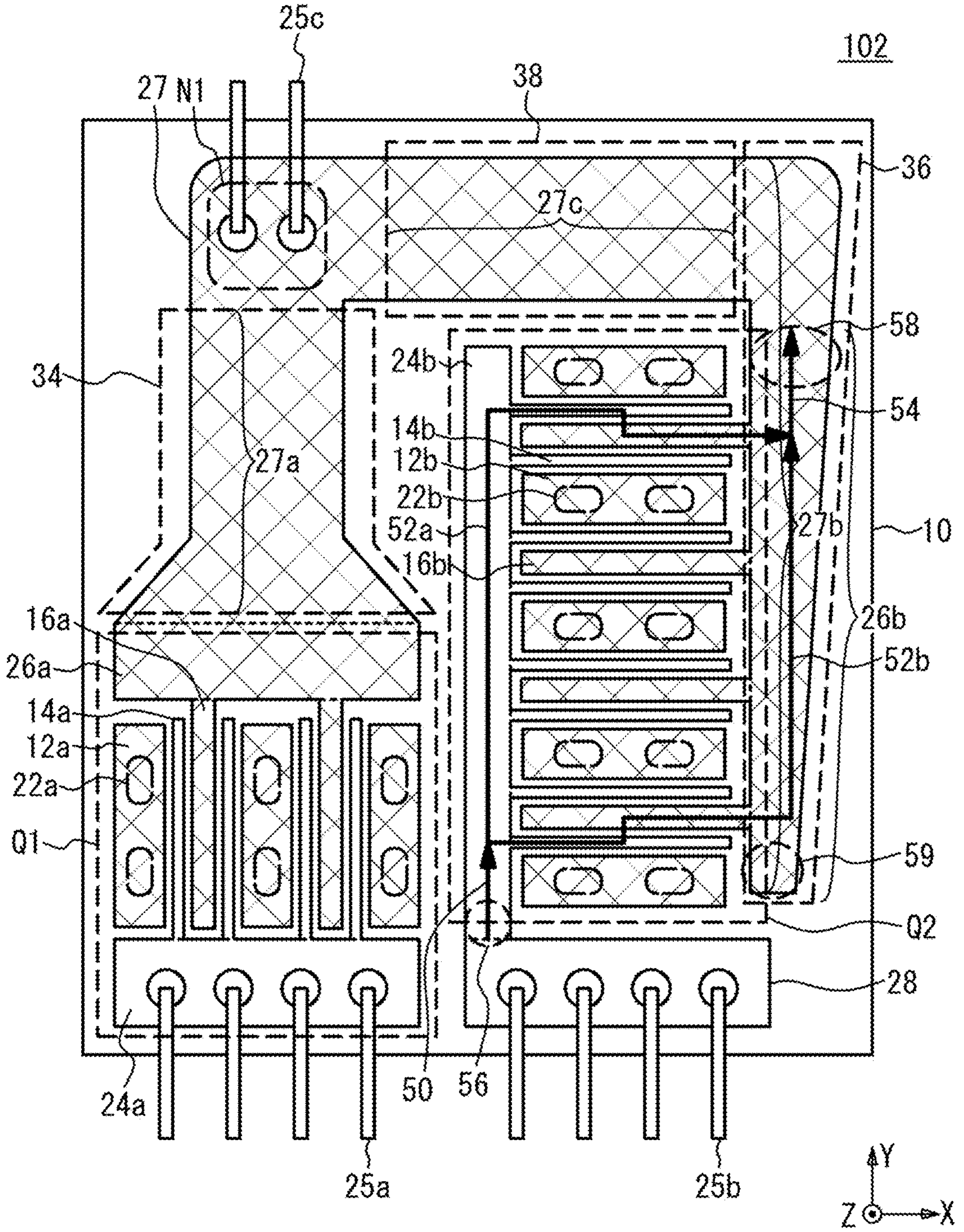
FIG. 5 is a plan view of a semiconductor chip according to a second embodiment.

FIG. 5 is a plan view of a semiconductor chip according to a second embodiment. In a semiconductor chip 102 of the second embodiment, a width in the X direction of the second end 58 of the drain bus bar 26*b* is larger than a width in the X direction of a third end 59 of the drain bus bar 26*b* opposite to the second end 58. Thus, the drain bus bar 26*b* can also function as the line 27*b* having the function of the matching circuit 36.

Third Embodiment

Figure 6:
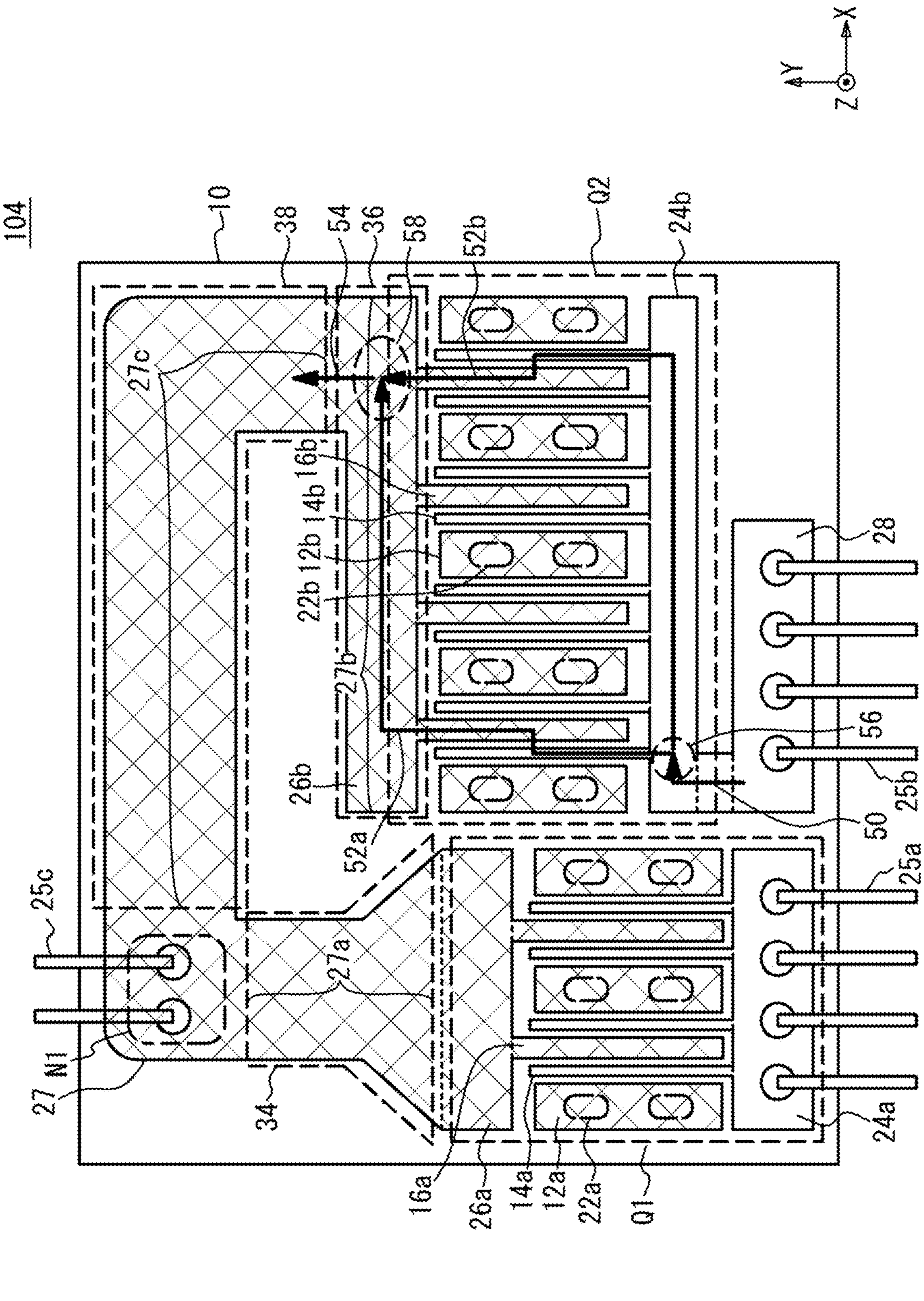
FIG. 6 is a plan view of a semiconductor chip according to a third embodiment.

FIG. 6 is a plan view of a semiconductor chip according to a third embodiment. In a semiconductor chip 104 of the third embodiment, the extending direction of the source electrodes 12*b*, the gate electrodes 14*b*, and the drain electrodes 16*b* of the transistor Q2 is the Y direction. The extending direction of the gate bus bar 24*b* and the drain bus bar 26*b* is the X direction. The gate pad 28 is electrically connected and short-circuited to the −end (first end 56) of the gate bus bar 24*b* in the X direction. The line 27*c* extends from the node N1 in the +direction of the X direction, and bends in the −direction of the Y direction at the +end in the X direction of the substrate 10. The −end in the Y direction of the line 27*c* is electrically connected to the +end (second end 58) in the X direction of the drain bus bar 26*b*. The line 27*b* also functions as the drain bus bar 26*b*. Other configurations are the same as those of the first embodiment, and description thereof is omitted.

In the third embodiment, the signal 52*a* of the signals 50 input to the first end 56 passes through the gate electrode 14*b* near the −end in the X direction, the drain electrode 16*b* and the drain bus bar 26*b*. The signal 52*b* of the signals 50 passes through the gate bus bar 24*b*, the gate electrode 14*b* near the +end in the X direction and the drain electrode 16*b*. The signals 52*a* and 52*b* are combined at the second end 58 of the drain bus bar 26*b* and output to the line 27*c* as the signal 54. The signals 52*a* and 52*b* pass through the gate bus bar 24*b* and the drain bus bar 26*b* by an equal distance, respectively. Therefore, the phase difference between the signals 52*a* and 52*b* becomes small. Therefore, when the signals 52*a* and 52*b* are combined, the combined loss due to the phase difference is less likely to occur. As a result, the deterioration of characteristics can be suppressed.

As in the third embodiment, the first direction in which the source electrodes 12*a*, the gate electrodes 14*a*, and the drain electrodes 16*a* of the transistor Q1 extend may be the same as the second direction in which the source electrodes 12*b*, the gate electrodes 14*b*, and the drain electrodes 16*b* of the transistor Q2 extend.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A Doherty amplifier comprising:
a substrate;
a first transistor provided on the substrate, the first transistor including:
a plurality of first gate electrodes extending in a first direction;
a plurality of first drain electrodes extending in the first direction;
a first gate bus bar to which a first signal of two signals obtained by dividing an input signal is input and to which the plurality of first gate electrodes are electrically connected; and
a first drain bus bar provided so as to dispose the plurality of first gate electrodes and the plurality of first drain electrodes between the first gate bus bar and the first drain bus bar, the plurality of first drain electrodes being electrically connected to the first drain bus bar;
a second transistor provided on the substrate, the transistor including:
a plurality of second gate electrodes extending in a second direction;
a plurality of second drain electrodes extending in the second direction;
a second gate bus bar having a first end to which a second signal of the two signals is input, the plurality of second gate electrodes being electrically connected to the second gate bus bar; and
a second drain bus bar provided so as to dispose the plurality of second gate electrodes and the plurality of second drain electrodes between the second gate bus bar and the second drain bus bar, the plurality of second drain electrodes being electrically connected to the second drain bus bar;
a combining node provided on the substrate and combining the first signal amplified by the first transistor and the second signal amplified by the second transistor;
a first line provided on the substrate and connecting the first drain bus bar and the combining node; and
a second line provided on the substrate, connecting the second drain bus bar and the combining node, and connected to a second end of the second drain bus bar located diagonally across the second transistor with respect to the first end.

2. The Doherty amplifier according to claim 1, wherein
the combining node is provided in a region of the first transistor positioned in the first direction, and
the first end is closer to the first transistor than the second end and is further from the combining node than the second end in the first direction.

3. The Doherty amplifier according to claim 2, wherein
a width of the second transistor in the first direction is larger than a width of the first transistor in the first direction, and
the second transistor overlaps with the first transistor and overlaps with at least a part of the first line when viewed from a direction orthogonal to the first direction.

4. The Doherty amplifier according to claim 3, wherein
a gate width of the second transistor is larger than a gate width of the first transistor.

5. The Doherty amplifier according to claim 4, wherein
the first direction and the second direction intersect each other.

6. The Doherty amplifier according to claim 4, wherein
the first direction and the second direction orthogonally intersect each other.

7. The Doherty amplifier according to claim 1, wherein
the second line includes an impedance converter.

8. The Doherty amplifier according to claim 1, wherein
a width of the second drain bus bar at the second end is larger than a width of the second drain bus bar at a third end opposite to the second end portion.

9. The Doherty amplifier according to claim 1, wherein
the first transistor includes a plurality of first source electrodes extending in the first direction,
one of the plurality of first gate electrodes is disposed between one of the plurality of first source electrodes and one of the plurality of first drain electrodes,
the second transistor includes a plurality of second source electrodes extending in the second direction, and
one of the second gate electrodes is disposed between one of the second source electrodes and one of the second drain electrodes.

10. The Doherty amplifier according to claim 1, wherein
the first transistor is a main amplifier, and the second transistor is a peak amplifier.

* * * * *